(12) United States Patent
Yuan et al.

(10) Patent No.: US 9,287,131 B2
(45) Date of Patent: Mar. 15, 2016

(54) METHODS OF PATTERNING LINE-TYPE FEATURES USING A MULTIPLE PATTERNING PROCESS THAT ENABLES THE USE OF TIGHTER CONTACT ENCLOSURE SPACING RULES

(71) Applicant: GLOBALFOUNDRIES Inc., Grand Cayman (KY)

(72) Inventors: Lei Yuan, Cupertino, CA (US); Jongwook Kye, Pleasanton, CA (US); Harry J. Levinson, Saratoga, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 66 days.

(21) Appl. No.: 14/186,396

(22) Filed: Feb. 21, 2014

(65) Prior Publication Data

US 2015/0243515 A1    Aug. 27, 2015

(51) Int. Cl.

| | | |
|---|---|---|
| *G06F 17/50* | (2006.01) | |
| *H01L 21/308* | (2006.01) | |
| *H01L 21/306* | (2006.01) | |
| *H01L 21/768* | (2006.01) | |
| *H01L 21/027* | (2006.01) | |
| *H01L 21/3213* | (2006.01) | |
| *G03F 1/70* | (2012.01) | |
| *G03F 7/00* | (2006.01) | |

(52) U.S. Cl.
CPC ........ *H01L 21/3088* (2013.01); *G06F 17/5068* (2013.01); *H01L 21/0274* (2013.01); *H01L 21/3081* (2013.01); *H01L 21/30604* (2013.01); *H01L 21/32139* (2013.01); *H01L 21/76816* (2013.01); *H01L 21/76877* (2013.01); *G03F 1/70* (2013.01); *G03F 7/0002* (2013.01)

(58) Field of Classification Search
CPC ............ H01L 21/3088; H01L 21/3081; H01L 21/76877; H01L 21/30604; H01L 21/76816; H01L 21/823431; G06F 17/5068; G03F 1/70; G03F 7/0002
USPC ................................................ 438/666; 430/5
See application file for complete search history.

(56) References Cited

U.S. PATENT DOCUMENTS

2013/0210232 A1*  8/2013  De et al. ................ 438/700

\* cited by examiner

*Primary Examiner* — Caleen Sullivan
(74) *Attorney, Agent, or Firm* — Amerson Law Firm, PLLC (57) ABSTRACT

A method involving identifying a pattern for an overall target cut mask to be used in patterning line-type features that includes a target non-rectangular opening feature having an inner, concave corner, decomposing the overall target cut mask pattern into first and second sub-target patterns, wherein the first sub-target pattern comprises a first rectangular-shaped opening feature corresponding to a first portion, but not all, of the target non-rectangular opening feature and the second sub-target pattern comprises a second rectangular-shaped opening feature corresponding to a second portion, but not all, of the target non-rectangular opening feature, the first and second openings overlapping adjacent the inner, concave corner, and generating first and second sets of mask data corresponding to the first and second sub-target patterns, wherein at least one of the first and second sets of mask data is generated based upon an identified contact-to-end-of-cut-line spacing rule.

15 Claims, 8 Drawing Sheets

METHODS OF PATTERNING LINE-TYPE FEATURES USING A MULTIPLE PATTERNING PROCESS THAT ENABLES THE USE OF TIGHTER CONTACT ENCLOSURE SPACING RULES

BACKGROUND OF THE INVENTION

1. Field of the Invention

Generally, the present disclosure relates to the manufacture of sophisticated semiconductor devices, and, more specifically, to various methods of patterning line-type features using a stitched, multiple patterned cut mask that enables the use of tighter contact enclosure spacing rules.

2. Description of the Related Art

Photolithography is one of the basic processes used in manufacturing integrated circuit products. At a very high level, photolithography involves: (1) forming a layer of light or radiation-sensitive material, such as photoresist, above a layer of material or a substrate; (2) selectively exposing the radiation-sensitive material to a light generated by a light source (such as a DUV or EUV source) to transfer a pattern defined by a mask or reticle (interchangeable terms as used herein) to the radiation-sensitive material; and (3) developing the exposed layer of radiation-sensitive material to define a patterned mask layer. Various process operations, such as etching or ion implantation processes, may then be performed on the underlying layer of material or substrate through the patterned mask layer.

Of course, the ultimate goal in integrated circuit fabrication is to faithfully reproduce the original circuit design on the integrated circuit product. Historically, the feature sizes and pitches (spacing between features) employed in integrated circuit products were such that a desired pattern could be formed using a single patterned photoresist masking layer. However, in recent years, device dimensions and pitches have been reduced to the point where existing photolithography tools, e.g., 193 nm wavelength immersion photolithography tools, cannot form a single patterned mask layer with all of the features of the overall target pattern. Accordingly, device designers have resorted to techniques that involve performing multiple exposures to define a single target pattern in a layer of material, which are often referred to as multiple patterning methods or techniques. There are various multiple patterning techniques. One such multiple patterning technique consists of initially forming continuous one dimensional line patterns and thereafter using a cut mask to cut the lines and to form the line ends. The continuous one dimensional line patterns can be formed by various patterning methods, such as EUV lithography, self-aligned double patterning (SADP), self-aligned quadruple patterning (SAQP) or directed self-assembly (DSA). As the overall chip layout continues to shrink as technology advances, two cut masks or a double patterning cut mask may be required to cut the lines so as to form a very dense layout. One common issue that occurs when trying to use a cut mask is that the inner corner rounding of non-rectangular features in a cut mask necessitate a large contact enclosure distance for the associated contact, which has negative impact on chip shrinkage. Therefore, there is a need for a solution of reducing the usage of large contact enclosure spacing rules and increasing the usage of tight contact enclosure spacing rules.

In the design of an integrated circuit product, an overall target pattern or design layout is created for the integrated circuit product. This design layout reflects the location of where various features will be formed in and above a semiconductor substrate, e.g., transistor structures, contact structures, metallization layers, etc. To fabricate the device, the substrate and various layers of material are patterned (or cut) to produce the desired features of the integrated circuit product. Additionally, during these process operations, trenches or openings may be formed in the substrate or one or more layers of material and thereafter filled with another material so as to define a desired feature of the product, such as a metal line that is formed in a previously-formed trench in a layer of insulating material. In general, this process proceeds layer by layer (starting with the substrate itself) until all of the features of the integrated circuit are formed.

Figure 1A:
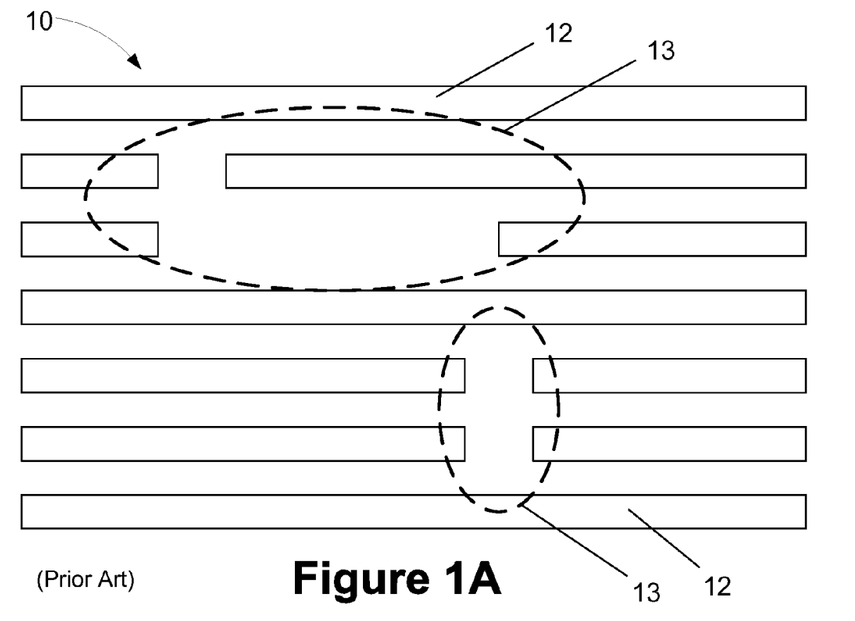
FIGS. 1A-1F depict one illustrative prior art technique of patterning a circuit layout comprised of line-type features using a double patterned cut mask.

FIG. 1A is an example of a portion of an overall target pattern 10 for a portion of the circuit layout for an integrated circuit product. In this example, the overall target pattern 10 is comprised of a plurality of line-type features 12, such as gate structures, metal lines, etc. In general, and as described more fully below, the overall target pattern 10 is created by initially forming continuous line-type features 12 across the substrate and thereafter patterning or cutting the line-type features 12 in the regions indicated in dashed-line areas 13 so as to physically separate the continuous line-type features 12 into the desired structures, i.e., separate gate structures or separate metal lines, etc.

Figure 1B:
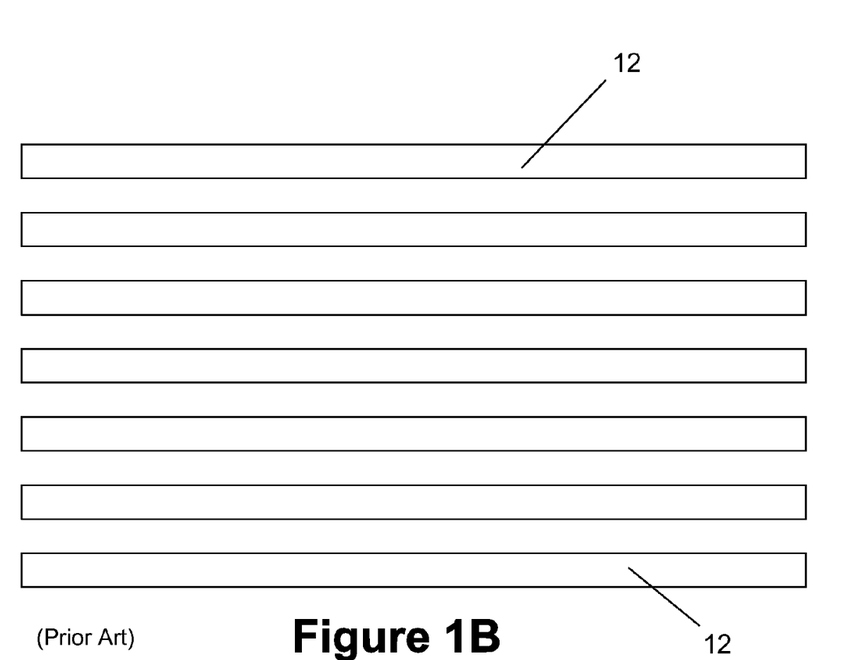

FIG. 1B depicts the product at a point in time where the continuous line-type features 12 have been formed above the substrate. As noted above, the line-type features 12 may be formed using traditional single-mask patterning techniques or multiple mask patterning techniques, such as double patterning, or EUV lithography, or directed self-assembly (DSA), etc. To arrive at the overall target pattern 10 depicted in FIG. 1A, the continuous line-type features 12 must be patterned or "cut" using a so-called "cut mask." In the case where the overall cut mask must be formed using double patterning techniques, this is accomplished by, among other things, forming two separate "cut masks," i.e., two separate patterned layers of photoresist material having openings therein. The two cut masks are sequentially formed above the continuous line-type features 12 which are patterned separately through each of the two cut masks. The combination of the openings in each of the first and second cut masks is intended to remove the desired portions of the continuous line-type features 12, i.e., the portions within the dashed-line regions 13 shown in FIG. 1A, so as to arrive at the desired overall target pattern 10 shown in FIG. 1A.

Figure 1C:
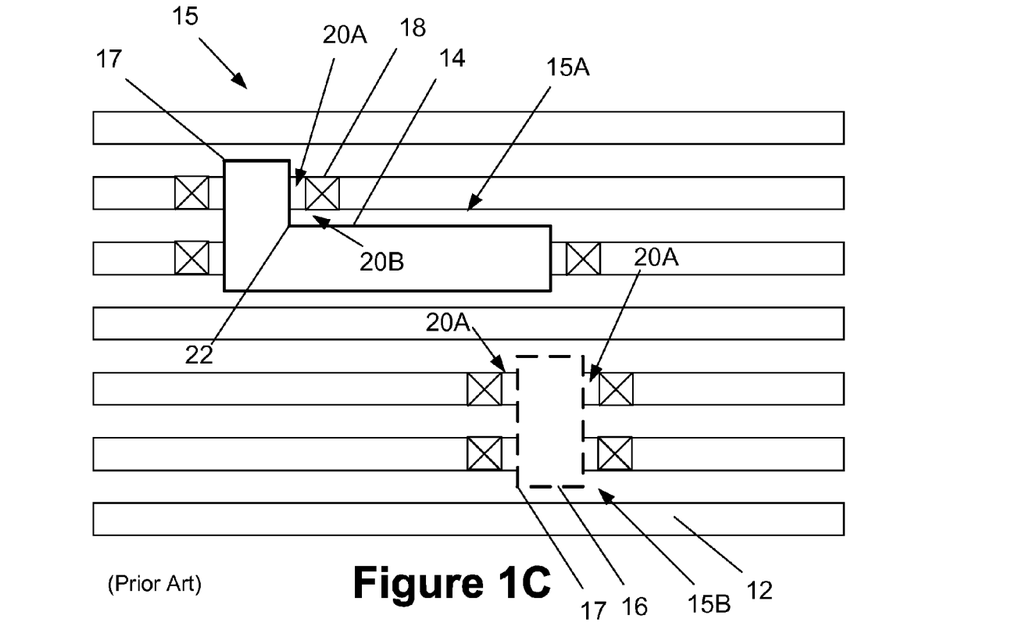
Figure 1D:
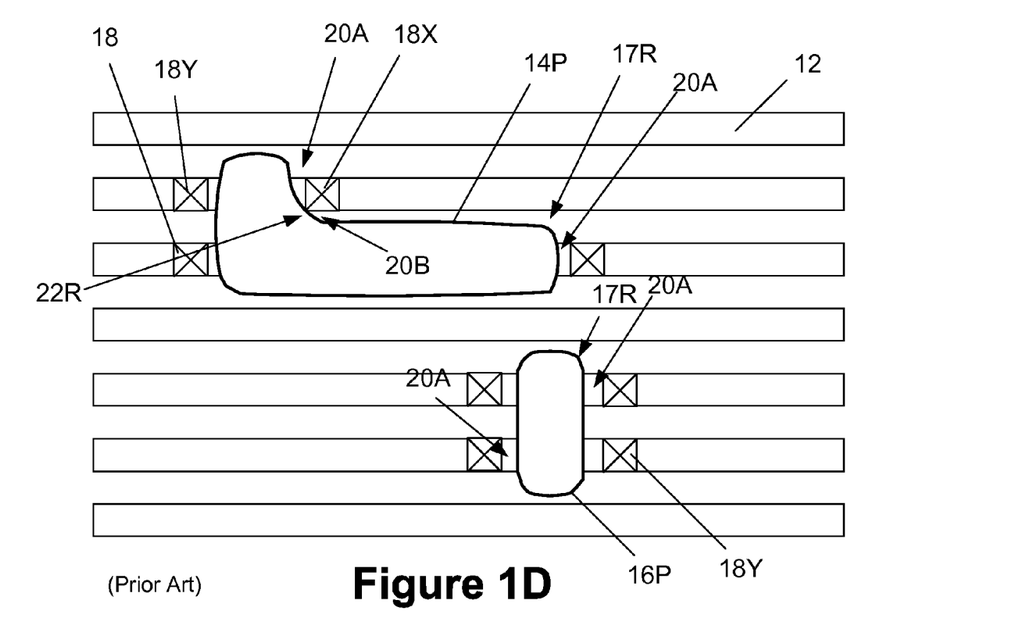
Figures 1E, 1F:
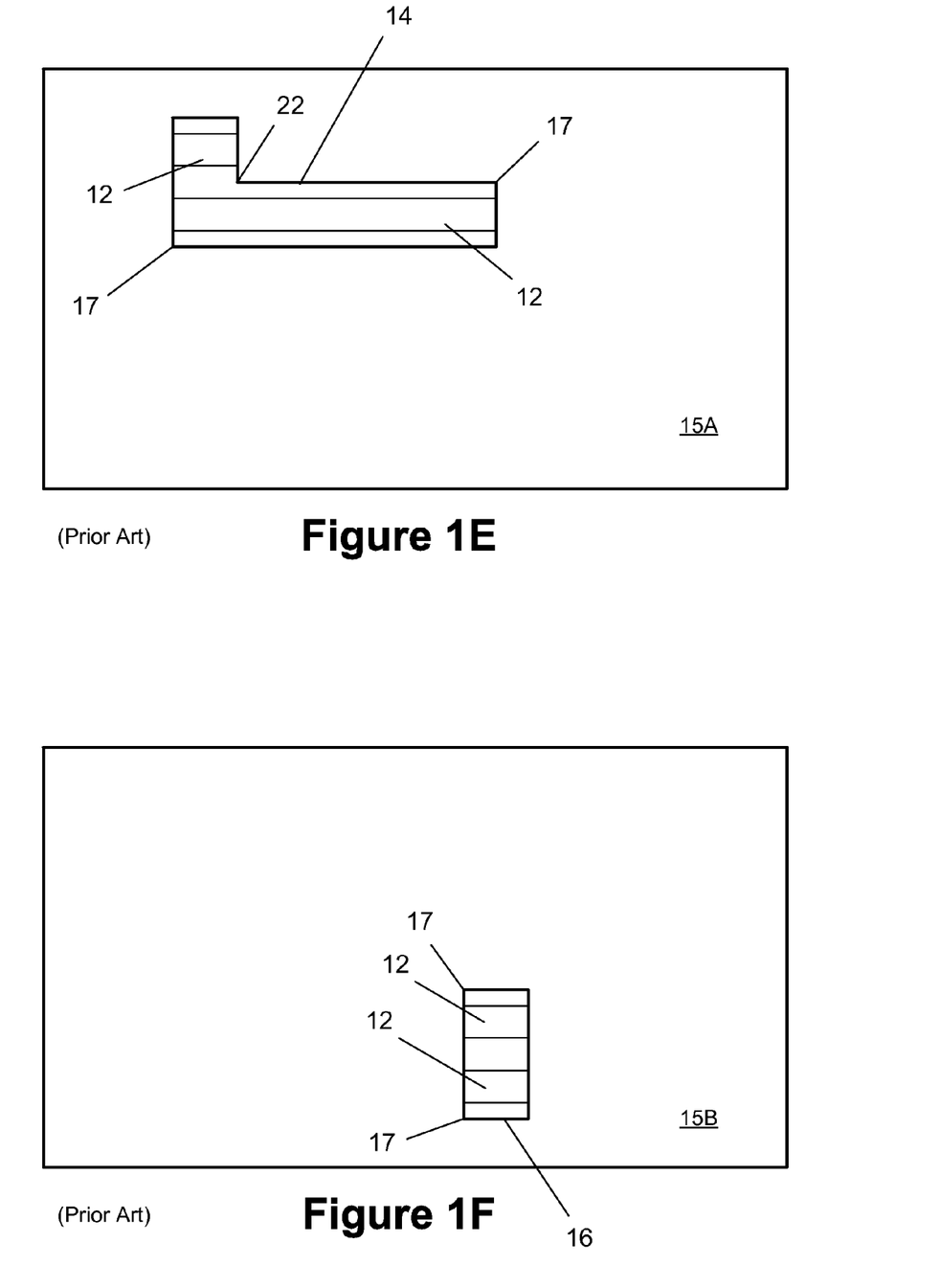

As noted above, the overall cut mask that is required to achieve the overall target pattern 10 is such that it cannot be printed using a single mask with available photolithography tools. Thus, in this illustrative example, the overall target pattern 15 for the overall cut mask is formed using two separate cut masks 15A, 15B. The cut mask 15B is depicted in FIG. 1C using dashed lines in an effort to distinguish it from the cut mask 15A, which is depicted with solid lines in FIG. 1C. Of course, as will be appreciated by those skilled in the art, only the openings 14, 16 of the cut masks 15A, 15B are depicted in FIG. 1C. FIG. 1E depicts the cut mask 15A while FIG. 1F depicts the cut mask 15B. The opening 14 is a non-rectangular opening, i.e., an L-shaped opening, while the opening 16 is a rectangular-shaped opening. As depicted, the cut mask 15A will be covering all portions of the continuous line-type features 12 that are not exposed by the non-rectangular opening 14 in the cut mask 15A. The cut mask 15B will be covering all portions of the continuous line-type features 12 that are not exposed by the rectangular-shaped opening 16 in the cut mask 15B. Accordingly, the overall target pattern 15 for the cut mask is decomposed into a first sub-target pattern (comprised of the non-rectangular opening feature 14), and a second sub-target pattern (comprised of the rectangular-shaped opening feature 16). The terminology "sub-target patterns" is used because each of the sub-target patterns contains less than all of the features in the overall target pattern 15 for the overall cut mask. The features that are incorporated in the sub-target patterns are selected and spaced such that the patterns in each of the sub-target patterns may be readily formed in a single masking layer using available photolithography tools. Ultimately, when the mask design process is completed, data corresponding to the first and second sub-target patterns (modified as necessary during the design process) will be provided to a mask manufacturer that will produce tangible masks corresponding to the sub-target patterns to be used in a photolithography tool to generate the first and second cuts masks 15A, 15B to manufacture the integrated circuit product.

With reference to FIGS. 1C and 1F, the rectangular-shaped opening 16 in the cut mask 15B is comprised of four "outer corners" 17 that have a convex configuration when viewed from outside of the opening 16. With reference to FIGS. 1C and 1E, the non-rectangular opening 14 in the first cut mask 15A has five "outer corners" 17 and one "inner corner" 22. In contrast to the outer corners 17, the inner corner 22 has a concave configuration when viewed from outside of the non-rectangular opening 14.

With continuing reference to FIG. 1C, also depicted are illustrative contacts 18 (generally referred to with the reference number 18, while specific contacts will have additional designations) that will subsequently be formed above the patterned line-type features 12 once the desired cuts have been made to the continuous line-type features 12. In designing the overall circuit layout, device designers must take great care to insure that the contact-to-line-end spacing 20A between the illustrative contact 18 and the cut end of the line is large enough so that, allowing for necessary processing margins when manufacturing the device, the location of the patterned end of the line-type features 12 is correctly positioned relative to the desired location of the contact 18 so that proper electrical contact can be made to the patterned line after the line-type features 12 have been cut. This minimum contact-to-line-end spacing requirement between the contact 18 and the associated end of the cut line-type feature 12 is sometimes referred to as a contact enclosure spacing rule. The spacing 20B between the contact 18 and the sides of the lines 12 is usually treated the same as the contact-to-line-end spacing 20A since the lines 12 are typically very thin (in terms of width).

The configurations of the cut masks 15A and 15B shown in FIG. 1C may be referred to as "as-drawn" configurations, as that is what is anticipated by the device designer when "drawing" the circuit layout. Unfortunately, when it comes to actually producing a real-world patterned photoresist mask and printing it on a wafer, there is a difference between the as-drawn configurations of the openings 14, 16 and the "as-printed" configurations of the openings 14, 16 in the actual patterned photoresist layers. That is, as shown in FIG. 1D, the as-printed openings 14P, 16P in the first and second cut masks 15A, 15B, respectively, tend to exhibit so-called corner rounding as compared to the as-drawn configuration of the openings 14, 16. This corner rounding is indicated by the reference numbers 17R and 22R in FIG. 1D. The rounding of the outer corners 17 of the openings 14, 16 is less problematic because it typically does not contribute to unacceptable amount of unwanted consumption of the line structures 12. However, corner rounding of the inner corner 22 of the non-rectangular opening 14 can cause several problems. Due to its location, the rounding of the inner corner 22R of the non-rectangular opening 14P may result in increasing the amount of the line-type feature 12 adjacent the contact structure 18X (see FIG. 1D) that is removed. As a result of these differences, a tighter (smaller) contact enclosure spacing rule can be used for the contacts labeled 18Y (i.e., the contacts 18Y can be positioned closer to the nearest cut end of the line) as compared to a looser (larger) contact enclosure spacing rule that must be used for the contact 18X which is positioned adjacent the line to be cut using the non-rectangular opening 14P with the inner corner 22R (i.e., the contacts 18X must be positioned farther away from its nearest end of line due to the unacceptable amount of line end consumption caused by the corner rounding of the inner corner 22 in the cut mask). As a result, there may be insufficient landing area for the contact 18X when it is formed, thereby making accurate alignment more difficult (considering necessary processing margins) and perhaps resulting in a contact structure that operates under conditions not anticipated by the design process. For example, if the contact area between the contact 18X and the underlying line 12 is less than anticipated by the design process, there may be a corresponding increase in electrical resistance, which may degrade device performance or may even result in a non-functioning circuit. One way to resolve the negative aspects of such corner rounding would be to increase the spacing between the end of a cut line 12 and the contact 18X, but such a corrective action would result in undesirable consumption of extremely valuable plot space on the substrate. Given the drive to continually reduce the size of integrated circuit products, there is a need to use every means possible to facilitate the use of increasingly tighter contact enclosure rules so as to help achieve the goal of producing such smaller products.

The present disclosure is directed to various methods of patterning line-type features using a stitched, multiple patterned cut mask that enables the use of tighter contact enclosure spacing rules which may solve or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of patterning line-type features using a stitched, multiple patterned cut mask that enables the use of tighter contact enclosure spacing rules. In one embodiment, a method disclosed herein includes, among other things, identifying a pattern for an overall target cut mask to be used in patterning a plurality of line-type features to be formed above a semiconductor substrate, wherein the overall target cut mask comprises a target non-rectangular opening feature having an inner, concave corner, decomposing the overall target cut mask pattern into a first sub-target pattern and a second sub-target pattern, wherein the first sub-target pattern comprises a first rectangular-shaped opening feature corresponding to a first portion, but not all, of the target non-rectangular opening feature and the second sub-target pattern comprises a second rectangular-shaped opening feature corresponding to a second portion, but not all, of the target non-rectangular opening feature, the first and second openings having an area of overlap at a location corresponding to a location of the inner, concave corner in the overall target cut mask, identifying a line-type feature that is to be cut by making cuts corresponding to the first and second openings, wherein, when cut, the cut line-type feature will have a cut end, identifying a contact that is to be formed so as to conductively contact the cut line-type feature at a location adjacent the cut end of the cut line-type feature, identifying a contact-to-end-of-cut-line spacing rule for the contact based upon a spacing between one of the first and second rectangular-shaped openings and a nearest edge of the contact at the intended location where the contact is to engage the cut line-type feature, generating a first set of mask data corresponding to the first sub-target pattern and generating a second set of mask data corresponding to the second sub-target pattern, wherein at least one of the first and second sets of mask data is generated based upon the identified contact-to-end-of-cut-line spacing rule.

Another illustrative method disclosed herein involves, among other things, identifying an overall target cut mask to be used in patterning a plurality of line-type features to be formed above a semiconductor substrate, wherein the overall target cut mask comprises a target non-rectangular opening feature having an inner, concave corner, forming the plurality of line-type features above a semiconductor substrate, forming a first patterned photoresist cut mask corresponding to a first sub-target pattern of the overall target cut mask, wherein the first patterned photoresist cut mask comprises a first rectangular-shaped opening feature corresponding to a first portion, but not all, of the target non-rectangular opening feature, patterning at least one of the plurality of line-type features by performing at least one first etching process through the first patterned photoresist cut mask, after performing the at least one first etching process, removing the first patterned photoresist etch mask, forming a second patterned photoresist cut mask corresponding to a second sub-target pattern of the overall target cut mask pattern, wherein the second patterned photoresist cut mask comprises a second rectangular-shaped opening feature corresponding to a second portion, but not all, of the target non-rectangular opening feature, wherein the first and second rectangular-shaped openings have an area of overlap at a location corresponding to a location of the inner, concave corner in the overall target cut mask, patterning at least one of the plurality of line-type features by performing at least one second etching process through the second patterned photoresist cut mask, after performing the at least one second etching process, removing the second patterned photoresist etch mask and forming a contact that is conductively coupled to the at least one plurality of line-type features that were patterned during at least one of the first and second etching processes, wherein the contact is formed at a location that is based upon a contact-to-end-of-cut-line spacing rule that is based upon a spacing between one of the first and second rectangular-shaped openings and a nearest edge of the contact.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of patterning line-type features using a stitched, multiple patterned cut mask that enables the use of tighter contact enclosure spacing rules. As will be readily apparent to those skilled in the art upon a complete reading of the present application, the methods and devices disclosed herein may be employed in the fabrication of a variety of devices, such as logic devices, memory devices, ASICs, etc. With reference to the attached figures, various illustrative embodiments of the methods and devices disclosed herein will now be described in more detail.

Figure 2A:
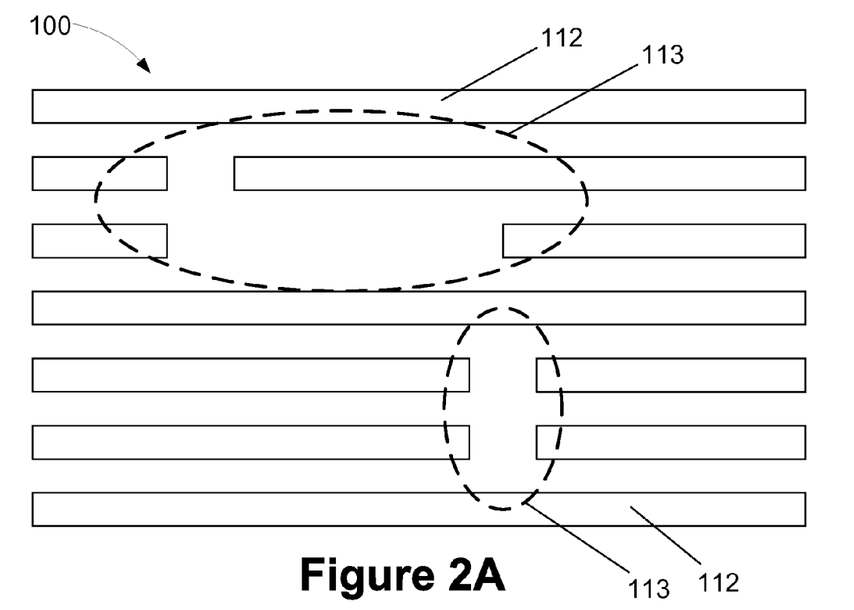
FIGS. 2A-2I depict various illustrative embodiments of various methods of patterning line-type features using a stitched, multiple patterned cut mask that enables the use of tighter contact enclosure spacing rules.

FIG. 2A is an example of a portion of an overall target pattern 100 for a portion of the circuit layout for an integrated circuit product. In this example, the overall target pattern 100 is comprised of a plurality of line-type features 112, such as gate structures, metal lines, etc. In general, and as described more fully below, the overall target pattern 100 is created by initially forming continuous line-type features 112 across a semiconductor substrate and thereafter patterning or cutting the line-type features 112 in the regions indicated in dashed-line areas 113 so as to physically separate the continuous line-type features 112 into the desired structures, i.e., separate gate structures or separate metal lines. As will be appreciated by those skilled in the art after a complete reading of the present application, the line-type features 112 are intended to be representative of any line-type feature that may be formed at any level of an integrated circuit product, irrespective of the techniques employed to form the initial line-type features 112, e.g., multiple patterning techniques or single mask patterning techniques. Thus, the present inventions should not be considered to be limited to the formation of any particular type of line-type features, nor the manner in which they are formed.

Figure 2B:
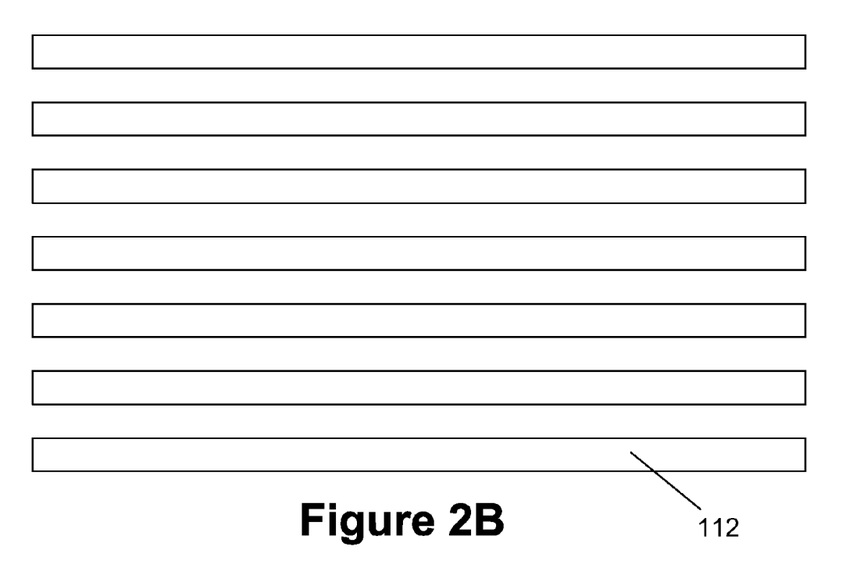

FIG. 2B depicts the product at a point in time where the continuous line-type features 112 have been formed above the substrate. As indicated above, to arrive at the overall target pattern 100 depicted in FIG. 2A, the continuous line-type features 112 must be patterned or "cut" using an overall target cut mask. In the depicted example, the openings in the overall target cut mask that are necessary to produce the overall target pattern 100 are spaced so close together that multiple patterning techniques must be employed. In the depicted example discussed herein, the cut mask will be formed using an illustrative double patterning technique. However, as will be appreciated by those skilled in the art after a complete reading of the present application, the methods disclosed herein may be employed when the cut mask is formed using two or more cut masks that each contain a portion of the overall target cut pattern. As it relates to the illustrative double patterning technique discussed herein, the overall cut mask pattern is achieved by, among other things, forming two separate "cut masks," i.e., by forming two separate patterned layers of photoresist material having openings therein above the continuous line-type features 112 and thereafter patterning the underlying continuous line-type features 112 separately through each of the two cut masks. Of course, the two separate cut masks may be used in any order as it does not matter which one is used first in the patterning operations. The combination of the openings in each of the first and second cut masks is intended to remove the desired portions of the continuous line-type features 112, i.e., the portions within the dashed-line regions 113 shown in FIG. 2A, so as to arrive at the desired overall target pattern 100 shown in FIG. 2A.

Figure 2C:
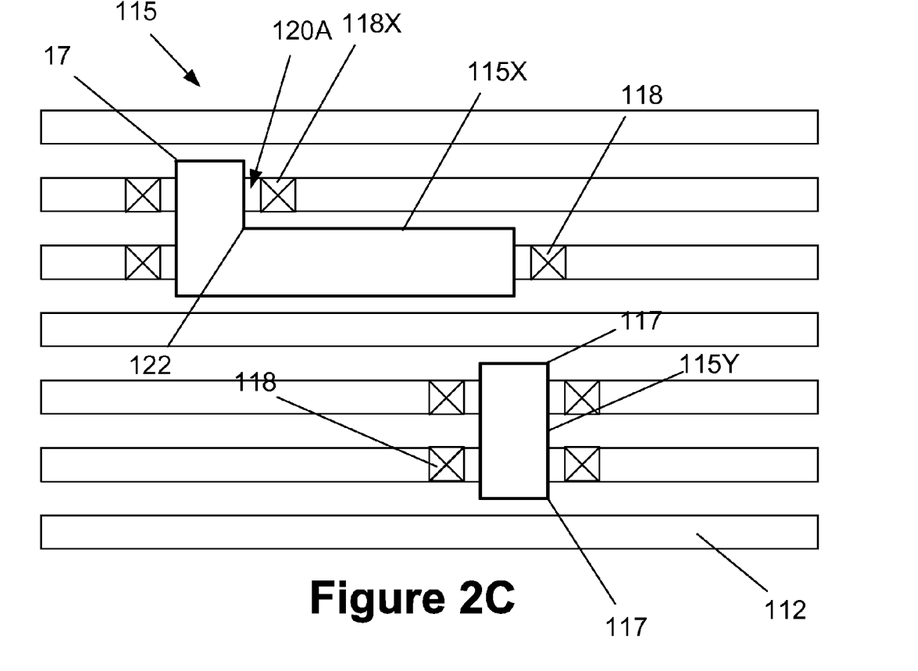

As depicted in FIG. 2C, the overall target cut mask 115 is comprised of "openings" 115X and 115Y that correspond to the portions of the continuous line-type features 112 that will need to be removed to result in the overall target pattern 100 shown in FIG. 2A. Also depicted are illustrative contacts 118 (generally referred to with the reference number 118, while specific contacts will have additional designations) that will subsequently be formed above the patterned line-type features 112 once the desired cuts have been made to the continuous line-type features 112. The opening 115X in the overall target cut mask 115 is a non-rectangular opening, i.e., an L-shaped opening, while the opening 115Y is a rectangular-shaped opening. As noted previously, in designing the overall circuit layout, device designers must take great care to insure that the contact-to-end-of-cut-line spacing 120A between the illustrative contact 118X and the "cut end" of the nearest adjacent line 112 is large enough so that, after the line has been cut, the end of the cut line-type feature 112 is correctly positioned relative to the desired location of the contact 118X so that proper electrical contact can be made to the cut line-type feature 112. As also noted above, this minimum contact-to-end-of-cut-line spacing 120A requirement between the contact 118X and the end of the cut line-type feature 112 is sometimes referred to as a contact enclosure spacing rule.

Figure 2D:
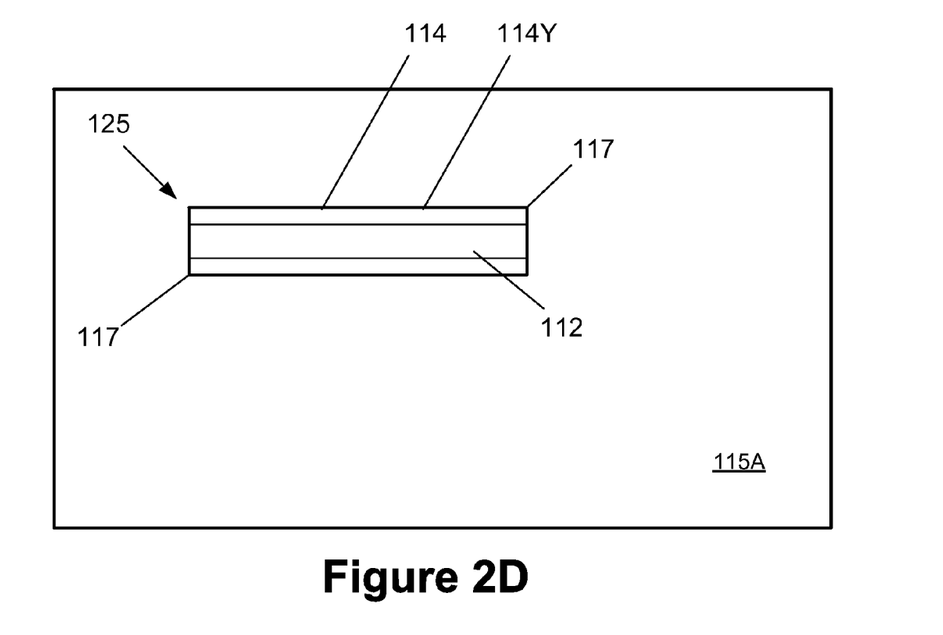
Figure 2E:
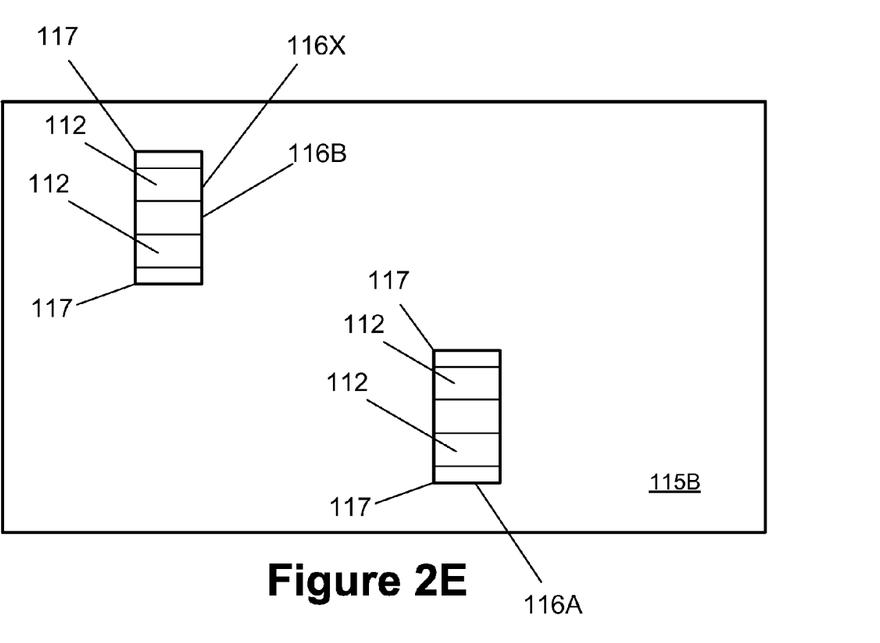

With continuing reference to FIG. 2C, and as noted above, the openings 115X, 115Y in the overall target cut mask are spaced so closely together that they cannot be printed using a single mask with available photolithography tools. Thus, with reference to FIGS. 2C-2E, in this illustrative example, the pattern of the overall target cut mask 115 is formed using two separate cut masks 115A, 115B. FIG. 2D depicts the cut mask 115A while FIG. 2E depicts the cut mask 115B. As depicted, in this example, the cut mask 115A is comprised of a single, rectangular-shaped opening 114. When used, the cut mask 115A will cover all portions of the continuous line-type features 112 that are not exposed by the rectangular-shaped opening 114 in the cut mask 115A. As depicted, the cut mask 115B is comprised of two spaced-apart rectangular-shaped openings 116A, 116B. Similarly, when used, the cut mask 115B will cover all portions of the continuous line-type features 112 that are not exposed by the rectangular-shaped openings 116A, 116B in the cut mask 115B. Accordingly, the pattern for the overall target cut mask 115 is decomposed into a first sub-target pattern (comprised of the rectangular-shaped opening feature 114 in the cut mask 115A), and a second sub-target pattern (comprised of the rectangular-shaped opening features 116A, 116B in the cut mask 115B). The terminology "sub-target patterns" is used because each of sub-target patterns contain less than all of the features in the overall target cut mask 115. The features that are incorporated in the sub-target patterns are selected and spaced such that the patterns in each of the sub-target patterns may be readily formed in a single masking layer using available photolithography tools. Ultimately, when the mask design process is completed, data corresponding to the first and second sub-target patterns (modified as necessary during the design process) will be provided to a mask manufacturer that will produce tangible masks corresponding to the sub-target patterns to be used in a photolithography tool to generate the first and second cuts masks 115A, 115B to manufacture the integrated circuit product. As will be appreciated by those skilled in the art after a complete reading of the present application, once the double patterning process is complete, the union between the rectangular-shaped opening 114 in the cut mask 115A and the rectangular-shaped opening 116B in the cut mask 115B will correspond to the desired cut or non-rectangular opening 115X in the overall target cut mask 115 shown in FIG. 2C. The rectangular-shaped opening 116A in the cut mask 115B will correspond to the desired cut or rectangular-shaped opening 115Y in the overall target cut mask 115 shown in FIG. 2C.

With continued reference to FIGS. 2C-2E, the openings 114, 116A, 116B in the cut masks 115A, 115B are openings that have rectangular configurations, each of which have four "outer corners" 117 that have a convex configuration when viewed from outside (i.e., from the direction indicated by the arrow 125 in FIG. 2D) of the respective openings. Note that, unlike the prior art processing techniques discussed previously, the cut corresponding to the non-rectangular opening 115X in the overall target cut mask 115 is formed without printing a non-rectangular opening that includes an inner corner, such as the inner corner 22 described in the background section of this application. That is, even though the non-rectangular opening 115X in the overall target cut mask 115 has an inner, concave corner 122 (see FIG. 2C), the methods disclosed herein provide a means of forming or printing the non-rectangular opening 115X without experiencing the adverse impact of the unacceptable inner-corner rounding noted in the background section of the application (see the previous discussion regarding the rounded corner 22R in the background section). Importantly, with reference to FIG. 2I, as used herein and in the claims, when it is stated that an opening has an "inner, concave corner" it means that, when viewed from the outside (i.e., from the direction indicated by the arrow 127) the inner, concave corner 122 is defined by two intersecting lines 122A, 122B, wherein the included angle 129 between the two intersecting lines is 135 degrees or less. In an idealized and theoretical situation, the angle 129 may be approximately ninety degrees.

As compared to the prior art techniques discussed in the background section of the application, none of the openings in the cut masks 115A or 115B disclosed herein have an inner, concave corner, like the inner, concave corner 22 depicted in FIGS. 1C-1E. Rather, using the novel methods disclosed herein, the cut corresponding to the inner, concave corner 122 of the non-rectangular opening 115X in the overall target cut mask 115 shown in FIG. 2C is formed by the intersection of the edge of a cut that corresponds to the side 114Y (FIG. 2D) of the rectangular opening 114 in the cut mask 115A with the intersection of the edge of a cut that corresponds to the side 116X (FIG. 2E) of the rectangular opening 116B in the cut mask 115B. That is, the rectangular-shaped opening 114 and the rectangular shaped-opening 116B have an area of overlap at a location corresponding to a location of the inner, concave corner 122 in the overall target cut mask. Thus, there is no corner rounding in the region of the inner, concave corner 122 of the opening 115X since it is formed by patterning the underlying line-type structures 112 using the overlapping, rectangular-shaped openings in two separate masking layers. Accordingly, with reference to FIG. 2C, the contact-to-end-of-cut-line spacing 120A may be maintained at a desired minimum value, without fear of the excessive corner rounding associated with patterning a single feature with an inner, concave corner (e.g., corner 122) which typically caused an undesirable error when patterning or cutting the desired portions of the line-type features 112. More specifically, the method disclosed herein involves identifying a contact-to-end-of-cut-line spacing rule 120A for a contact 118 that is to be formed so as to conductively contact a cut line-type feature 112 adjacent an end of the cut line type feature, wherein the contact-to-end-of-cut-line spacing rule 120A is based upon a spacing between the side 116X (see FIG. 2E) of the rectangular-shaped opening 116B (in the depicted example) and a nearest edge 118E (see FIG. 2H) of the contact 118 at the intended location where the contact 118 is to engage the cut line-type feature 112.

Figure 2F:
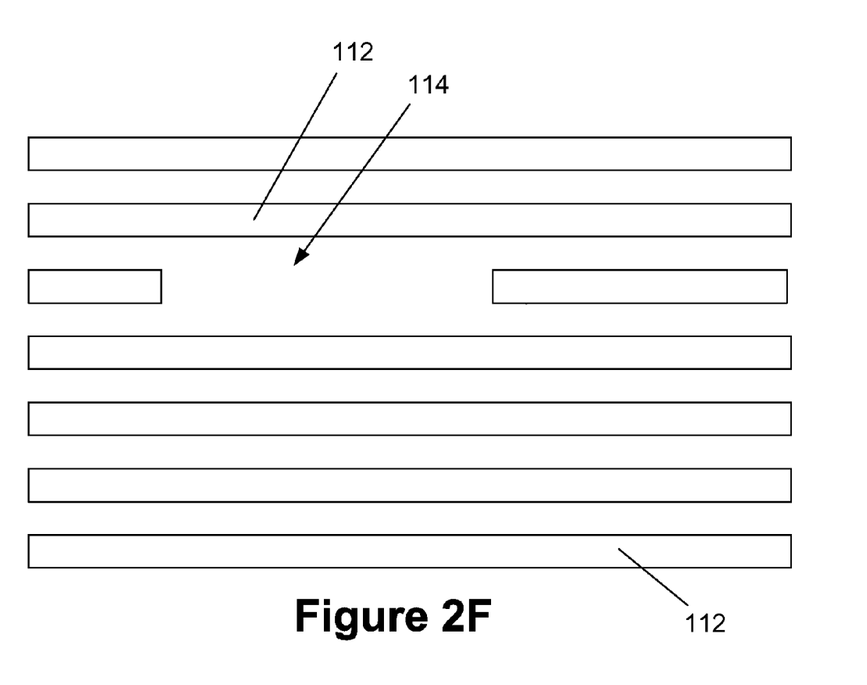

FIG. 2F depicts the product after the cut mask 115A has been employed to pattern the continuous line-type features 112. Note the portion of the line-type feature 112 corresponding to the opening 114 in the cut mask 115A has been removed.

Figure 2G:
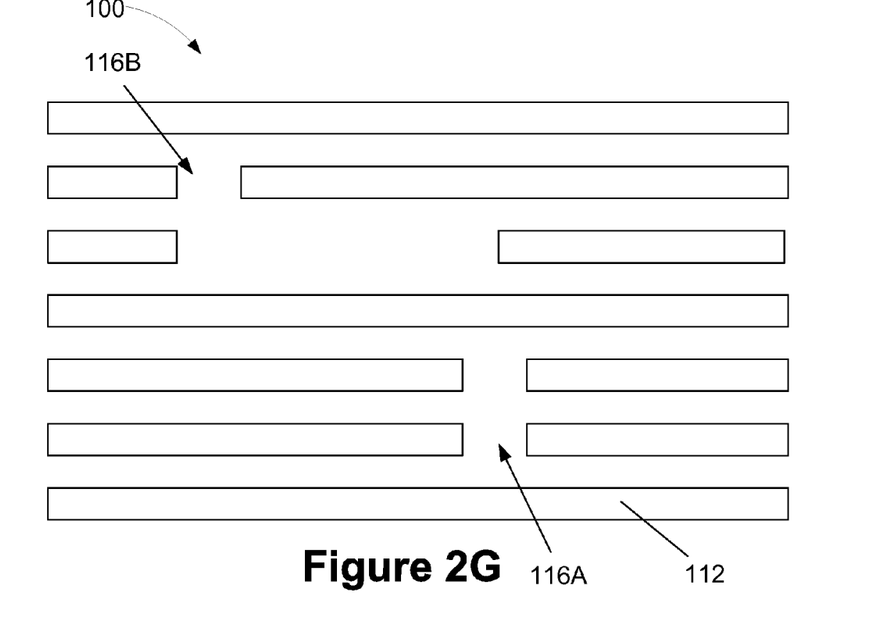

FIG. 2G depicts the product after the cut mask 115A has been removed and after the cut mask 115B has been formed above the device and employed to further pattern the continuous line-type features 112. Note the portions of the line-type features 112 corresponding to the openings 116A, 116B in the cut mask 115B have been removed. Of course, as noted above, the cut masks 115A, 115B may be used in either order.

Figure 2H:
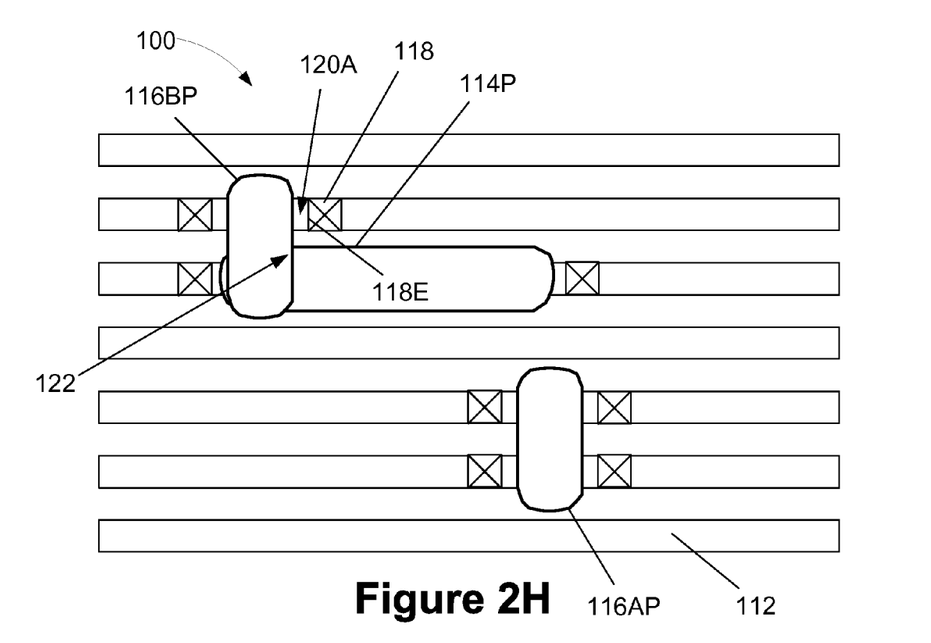
Figure 2I:
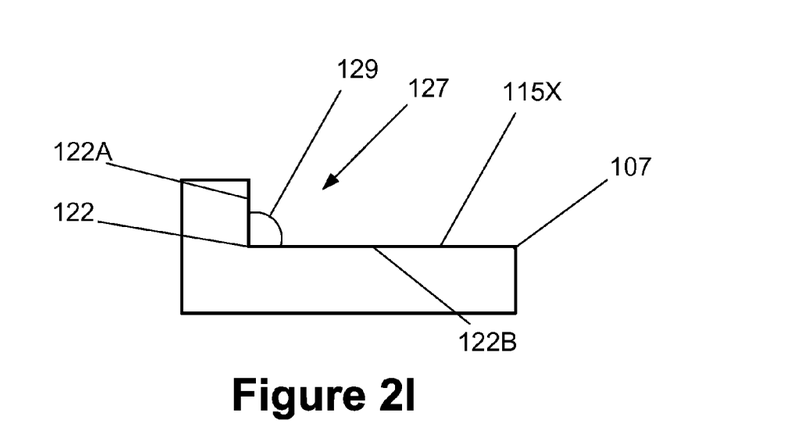

The configurations of the openings 114, 116A and 116B shown in FIG. 2C may be referred to as "as-drawn" configurations, as that is what is anticipated by the device designer when "drawing" the circuit layout. As noted previously, when it comes to actually producing a real-world patterned photoresist mask and printing it on a wafer, there is a difference between the as-drawn configurations of the openings 114, 116A, 116B and the "as-printed" configurations of the openings in the patterned masking layers. FIG. 2H is a simplistic depiction of the as-printed openings 114P, 116AP and 116BP in the first and second cut masks 115A, 115B, respectively. Note the absence of the undesirable inner corner rounding in the area of the inner, concave corner 122 in the original overall cut mask pattern, as compared to the corner rounding 22R shown in the as-printed configuration of the non-rectangular opening 14 shown in FIG. 1D, wherein a feature that included an inner, concave corner was printed as a single feature.

Figure 3:
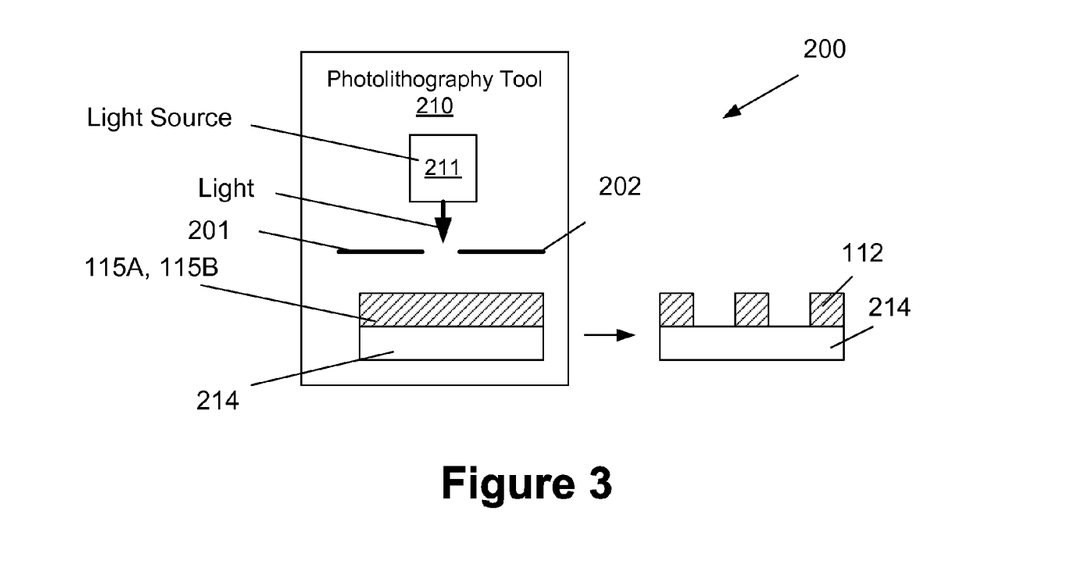
FIG. 3 depicts an illustrative embodiment of a novel system disclosed herein.

FIG. 3 schematically depicts an illustrative system 200 comprised of an illustrative photolithography tool 210 (having a light source 211), reticles 201 and 202 that correspond to the sub-target patterns associated with cut masks 115A, 115B, respectively, an illustrative substrate or wafer 214 and a plurality of patterned line-type features 112 formed above the wafer 214. The reticles 201 and 202 are depicted as being positioned side by side in the illustrative photolithography tool 210, but those skilled in the art will recognize that the reticles 201 and 202 will be used in a sequential fashion in a double patterning process and they may be used in any order. At least portions of the data to be used in manufacturing the reticles 201 and 202 may be generated based on data corresponding to the first sub-target pattern and the second sub-target pattern, respectively, as described above. The data may then be provided to a reticle manufacturer to manufacture the reticles 201 and 202. The reticles 201 and 202 may then be employed in the photolithography tool 210 (which may be of any desired configuration and employ any desired wavelength or form of radiation, such as EUV) in a sequence of traditional photolithography operations, whereby the overall target pattern 115 for the overall cut mask, defined by the combination of the features in both of the reticles 201 and 202, may be used to pattern the line-type features 112. The reticles 201 and 202 may be used to form patterned layers of material above subsequently processed wafers as processing continues.

As will be recognized by those skilled in the art after a complete reading of the present application, various novel inventions are disclosed herein. In one embodiment, a method disclosed herein includes, among other things, identifying a pattern for an overall target cut mask 115 to be used in patterning a plurality of line-type features 112 to be formed above a semiconductor substrate, wherein the overall target cut mask 115 comprises a target non-rectangular opening feature 115X having an inner, concave corner 122, decomposing the overall target cut mask pattern into a first sub-target pattern and a second sub-target pattern, wherein the first sub-target pattern comprises a first rectangular-shaped opening feature 114 corresponding to a first portion, but not all, of the target non-rectangular opening feature 115X and the second sub-target pattern comprises a second rectangular-shaped opening feature 116B corresponding to a second portion, but not all, of the target non-rectangular opening feature 115X, the first and second openings having an area of overlap at a location corresponding to the location of the inner, concave corner 122 in the overall target cut mask, identifying a line-type feature 112 that is to be cut by making cuts corresponding to the first and second openings, wherein, when cut, the cut line-type feature will have a cut end, identifying a contact 118X that is to be formed so as to conductively contact the cut line-type feature at a location adjacent the cut end of the cut line-type feature 112, identifying a contact-to-end-of-cut-line spacing rule 120A for the contact 118X based upon a spacing between one of the first and second rectangular-shaped openings and a nearest edge 118E of the contact at the intended location where the contact 118X is to engage the cut line-type feature, generating a first set of mask data corresponding to the first sub-target pattern and generating a second set of mask data corresponding to the second sub-target pattern, wherein at least one of the first and second sets of mask data is generated based upon the identified contact-to-end-of-cut-line spacing rule 120A.

Another illustrative method disclosed herein involves, among other things, identifying an overall target cut mask 115 to be used in patterning a plurality of line-type features 112 to be formed above a semiconductor substrate, wherein the overall target cut mask comprises a target non-rectangular opening feature 115X having an inner, concave corner 122, forming the plurality of line-type structures 112 above a semiconductor substrate, forming a first patterned photoresist cut mask corresponding to a first sub-target pattern of the overall target cut mask, wherein the first patterned photoresist cut mask comprises a first rectangular-shaped opening feature 114 corresponding to a first portion, but not all, of the target non-rectangular opening feature 115X, patterning at least one of the plurality of line-type features 112 by performing at least one first etching process through the first patterned photoresist cut mask, after performing the at least one first etching process, removing the first patterned photoresist etch mask, forming a second patterned photoresist cut mask corresponding to a second sub-target pattern of the overall target cut mask, wherein the second patterned photoresist cut mask comprises a second rectangular-shaped opening feature 116B corresponding to a second portion, but not all, of the target non-rectangular opening feature 115X, wherein the first and second rectangular-shaped openings 114, 116B have an area of overlap at a location corresponding to the location of the inner, concave corner 122 in the overall target cut mask, patterning at least one of the plurality of line-type features 112 by performing at least one second etching process through the second patterned photoresist cut mask, after performing the at least one second etching process, removing the second patterned photoresist etch mask and forming a contact 118 that is conductively coupled to the at least one plurality of line-type features 112 that were patterned during at least one of the first and second etching processes, wherein the contact 118 is formed at a location that is based upon a contact-to-end-of-cut-line spacing rule 120A that is based upon a spacing between one of the first and second rectangular-shaped openings and a nearest edge 118X of the contact 118.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:
1. A method, comprising:
identifying a pattern for an overall target cut mask to be used in patterning a plurality of line-type features to be formed above a semiconductor substrate, wherein said overall target cut mask comprises a target non-rectangular opening feature having an inner, concave corner;
decomposing said overall target cut mask pattern into a first sub-target pattern and a second sub-target pattern, wherein said first sub-target pattern comprises a first rectangular-shaped opening feature corresponding to a first portion, but not all, of said target non-rectangular opening feature and said second sub-target pattern comprises a second rectangular-shaped opening feature corresponding to a second portion, but not all, of said target non-rectangular opening feature, said first and second openings having an area of overlap at a location corresponding to a location of said inner, concave corner in said overall target cut mask;
identifying a line-type feature that is to be cut by making cuts corresponding to said first and second openings, wherein, when cut, said cut line-type feature will have a cut end;
identifying a contact that is to be formed so as to conductively contact said cut line-type feature at a location adjacent said cut end of said cut line-type feature;
identifying a contact-to-end-of-cut-line spacing rule for said contact based upon a spacing between one of said first and second rectangular-shaped openings and a nearest edge of said contact at the intended location where said contact is to engage said cut line-type feature;
generating a first set of mask data corresponding to said first sub-target pattern; and
generating a second set of mask data corresponding to said second sub-target pattern, wherein at least one of said first and second sets of mask data is generated based upon the identified contact-to-end-of-cut-line spacing rule.

2. The method of claim 1, further comprising providing said first and second sets of mask data to a mask manufacturer.

3. The method of claim 1, wherein said inner, concave corner of said target non-rectangular opening feature is defined by first and second intersecting lines and wherein said first rectangular-shaped opening is defined, in part, by a line that includes a linear portion corresponding to said first line and said second rectangular-shaped opening is defined, in part, by a line that includes a linear portion corresponding to said second line.

4. The method of claim 1, further comprising
forming said plurality of line-type features above said substrate;
forming a first patterned photoresist cut mask using a mask corresponding to one of said first and second sets of mask data;
patterning at least one of said plurality of line-type features by performing at least one first etching process through said first patterned photoresist cut mask;
after performing said at least one first etching process, removing said first patterned photoresist etch mask;
forming a second patterned photoresist cut mask using a mask corresponding to the other of said first and second sets of mask data;
patterning at least one of said plurality of line-type features by performing at least one second etching process through said second patterned photoresist cut mask;
after performing said at least one second etching process, removing said second patterned photoresist etch mask; and
forming said contact such that it is conductively coupled to one of the patterned plurality of line-type features.

5. The method of claim 1, wherein said plurality of line-type features comprises gate structures or metal lines.

6. The method of claim 1, wherein the identified contact-to-end-of-cut-line spacing rule is established without having to account for inner corner rounding of said inner, concave corner in said overall target cut mask.

7. A method of patterning a plurality of line-type features, comprising:
identifying an overall target cut mask to be used in patterning said plurality of line-type features to be formed above a semiconductor substrate, wherein said overall target cut mask comprises a target non-rectangular opening feature having an inner, concave corner;
forming said plurality of line-type features above said semiconductor substrate;
forming a first patterned photoresist cut mask corresponding to a first sub-target pattern of said overall target cut mask, wherein said first patterned photoresist cut mask comprises a first rectangular-shaped opening feature corresponding to a first portion, but not all, of said target non-rectangular opening feature;
patterning at least one of said plurality of line-type features by performing at least one first etching process through said first patterned photoresist cut mask;
after performing said at least one first etching process, removing said first patterned photoresist etch mask;
forming a second patterned photoresist cut mask corresponding to a second sub-target pattern of said overall target cut mask pattern, wherein said second patterned photoresist cut mask comprises a second rectangular-shaped opening feature corresponding to a second portion, but not all, of said target non-rectangular opening feature, wherein said first and second rectangular-shaped openings have an area of overlap at a location corresponding to a location of said inner, concave corner in said overall target cut mask;
patterning at least one of said plurality of line-type features by performing at least one second etching process through said second patterned photoresist cut mask;
after performing said at least one second etching process, removing said second patterned photoresist etch mask; and
forming a contact that is conductively coupled to said at least one of said plurality of line-type features that were patterned during at least one of said first and second etching processes, wherein said contact is formed at a location that is based upon a contact-to-end-of-cut-line spacing rule that is based upon a spacing between one of said first and second rectangular-shaped openings and a nearest edge of said contact.

8. The method of claim 7, wherein said inner, concave corner of said target non-rectangular opening feature is defined by first and second intersecting lines and wherein said first rectangular-shaped opening is defined, in part, by a line that includes a linear portion corresponding to said first line and said second rectangular-shaped opening is defined, in part, by a line that includes a linear portion corresponding to said second line.

9. The method of claim 7, wherein said plurality of line-type features comprises gate structures or metal lines.

10. The method of claim 7, wherein the identified contact-to-end-of-cut-line spacing rule is established without having to account for inner corner rounding of said inner, concave corner in said overall target cut mask.

11. A method, comprising:
identifying a pattern for an overall target cut mask to be used in patterning a plurality of line-type features to be formed above a semiconductor substrate, wherein said overall target cut mask comprises a target non-rectangular opening feature having an inner, concave corner;
decomposing said overall target cut mask pattern into a first sub-target pattern and a second sub-target pattern, wherein said first sub-target pattern comprises a first rectangular-shaped opening feature corresponding to a first portion, but not all, of said target non-rectangular opening feature and said second sub-target pattern comprises a second rectangular-shaped opening feature corresponding to a second portion, but not all, of said target non-rectangular opening feature, said first and second openings having an area of overlap at a location corresponding to a location of said inner, concave corner in said overall target cut mask;
generating a first set of mask data corresponding to said first sub-target pattern; and
generating a second set of mask data corresponding to said second sub-target pattern.

12. The method of claim 11, further comprising providing said first and second sets of mask data to a mask manufacturer.

13. The method of claim 11, wherein said inner, concave corner of said target non-rectangular opening feature is defined by first and second intersecting lines and wherein said first rectangular-shaped opening is defined, in part, by a line that includes a linear portion corresponding to said first line and said second rectangular-shaped opening is defined, in part, by a line that includes a linear portion corresponding to said second line.

14. The method of claim 11, further comprising
forming said plurality of line-type features above said substrate;
forming a first patterned photoresist cut mask using a mask corresponding to one of said first and second sets of mask data;
patterning at least one of said plurality of line-type features by performing at least one first etching process through said first patterned photoresist cut mask;
after performing said at least one first etching process, removing said first patterned photoresist etch mask;
forming a second patterned photoresist cut mask using a mask corresponding to the other of said first and second sets of mask data;
patterning at least one of said plurality of line-type features by performing at least one second etching process through said second patterned photoresist cut mask;
after performing said at least one second etching process, removing said second patterned photoresist etch mask; and
forming said contact such that it is conductively coupled to one of the patterned plurality of line-type features.

15. The method of claim 11, wherein said plurality of line-type features comprises gate structures or metal lines.

* * * * *